(12) United States Patent
Chakraborty et al.

(10) Patent No.: US 11,114,991 B2
(45) Date of Patent: Sep. 7, 2021

(54) ANALOG FRONT-END CIRCUIT FOR CONDITIONING A SENSOR SIGNAL

(71) Applicant: International Business Machines Corporation, Armonk, NY (US)

(72) Inventors: Sudipto Chakraborty, Plano, TX (US); Rajiv Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 16/540,320

(22) Filed: Aug. 14, 2019

(65) Prior Publication Data

US 2021/0050829 A1 Feb. 18, 2021

(51) Int. Cl.
  *H03F 3/191* (2006.01)
  *H03F 3/45* (2006.01)
  *H03M 1/12* (2006.01)

(52) U.S. Cl.
  CPC .......... *H03F 3/45179* (2013.01); *H03M 1/12* (2013.01); *H03F 2200/171* (2013.01); *H03F 2200/375* (2013.01)

(58) Field of Classification Search
  CPC ...... H03F 3/45; H03F 3/191; H03F 2200/102; H03F 2200/375
  USPC .......................... 330/303; 327/552, 553, 554
  See application file for complete search history.

(56) References Cited

U.S. PATENT DOCUMENTS

| | | | |
|---|---|---|---|
| 6,982,664 B1 | 1/2006 | Nairn | |
| 7,299,006 B1 * | 11/2007 | Rofougaran | H03D 3/244 323/267 |
| 8,301,103 B2 | 10/2012 | Huang et al. | |
| 9,313,075 B2 | 4/2016 | Azizi et al. | |
| 9,444,515 B2 | 9/2016 | Khan et al. | |
| 9,742,600 B2 | 8/2017 | Nair et al. | |
| 9,882,428 B2 | 1/2018 | Calhoun et al. | |
| 2009/0191821 A1 * | 7/2009 | Kavadias | H03D 7/1441 455/73 |
| 2014/0266454 A1 * | 9/2014 | Testi | H03G 3/008 330/284 |
| 2020/0313636 A1 * | 10/2020 | Shrivastava | H03F 3/005 |

FOREIGN PATENT DOCUMENTS

WO 2009092771 A1 7/2009

OTHER PUBLICATIONS

Hu et al. "An Ultra-Low Power Interface CMOS IC Design for Biosensor Applications", 978-1-4673-2527-1/12, IEEE, 4 pages.

* cited by examiner

*Primary Examiner* — Steven J Mottola
(74) *Attorney, Agent, or Firm* — Patterson + Sheridan, LLP

(57) ABSTRACT

An analog front-end (AFE) circuit for conditioning a sensor signal is disclosed. The AFE circuit includes a first stage configured to amplify and filter the sensor signal. The first stage comprises a biquadratic filter comprising a first plurality of DC-coupled transconductance amplifiers. The AFE further includes a second stage configured to further amplify and filter the amplified sensor signal, and to compensate a direct current (DC) offset of the first stage. The second stage comprises a second plurality of AC-coupled transconductance amplifiers. Each transconductance amplifier of the first plurality and of the second plurality has a programmable transconductance and comprises a plurality of subthreshold-biased transistors.

18 Claims, 12 Drawing Sheets

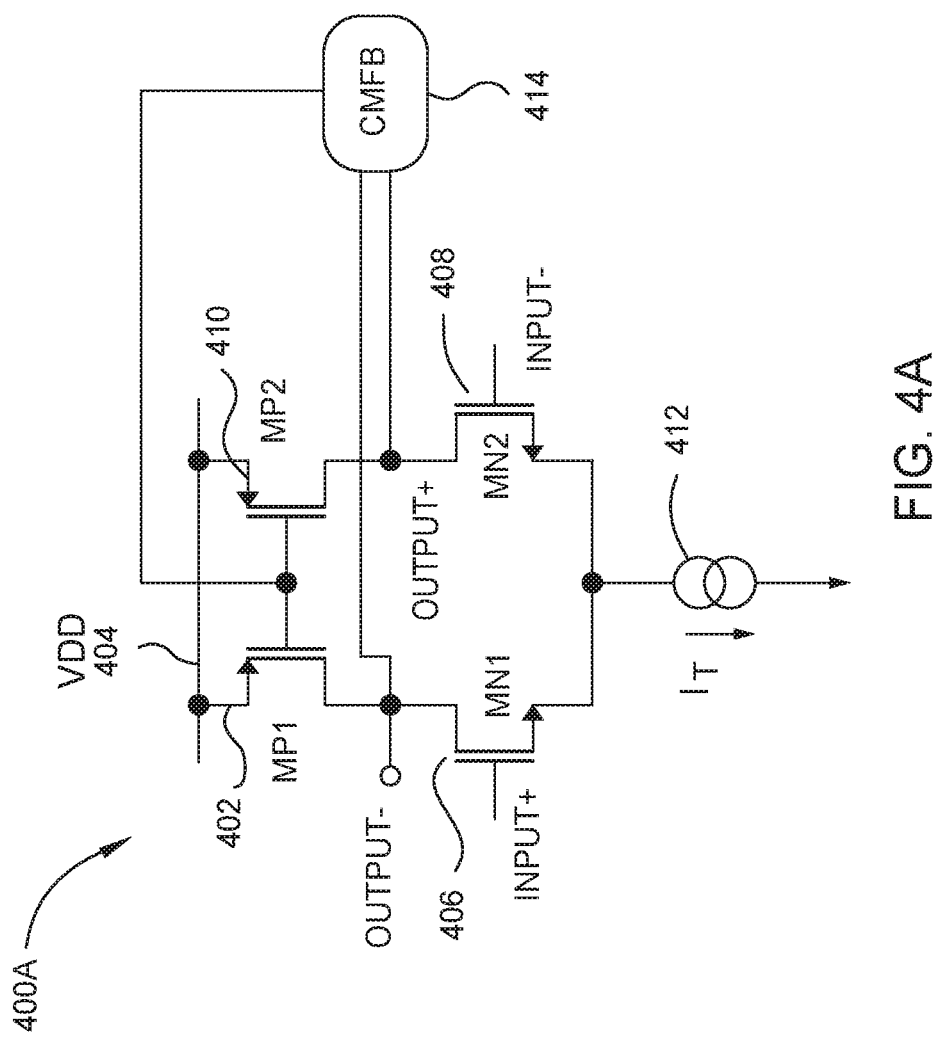

ANALOG FRONT-END CIRCUIT FOR CONDITIONING A SENSOR SIGNAL

BACKGROUND

The present invention relates to sensor signal detection, and more specifically, to an analog front-end circuit for conditioning the sensor signal before detection.

A sensor is defined as a device or a module that helps to detect any changes in a physical quantity (such as pressure or force) in terms of an electrical quantity (such as current, voltage, or power) or any other form of energy. After observing the changes, the sensor sends its output signal to a detection circuit, such as a comparator, or digitally to a microcontroller or microprocessor via an analog-to-digital converter to detect the sensor signal and measure parameters of the sensor signal. The output signal can be either optical, electrical, or any form of signal that corresponds to change in input signal. Example types of sensors include infrared sensors, temperature sensors, proximity sensors, ultrasonic sensors, accelerometers, gyroscope sensors, pressure sensors, Hall effect sensors, load cells light sensors, color sensors, touch sensors, tilt sensors, vibration sensors, metal detectors, water flow sensors, heartbeat sensors (EKG), flow and level sensors, smoke sensors, fog sensors, gas sensors, ethanol and alcohol sensors, humidity sensors, soil moisture and rain sensors, among others.

Before providing the sensor output signal to a detector circuit or a microprocessor, the readable output signal may need to be converted to an electrical signal, such as a voltage or a current. As the electrical signal may be very small in amplitude and may contain noise, analog signal conditioning may be applied to the output sensor signal using an analog front-end circuit before it is digitized and detected. An analog front-end (AFE) includes analog signal conditioning circuitry such as analog amplifiers, often operational amplifiers, filters, and sometimes application-specific integrated circuits. Traditional AFEs for ultra-low power/amplitude applications include switched capacitor filters and chopper circuits. However, switched capacitor filters and chopper circuits may tend to consume higher current, and may be subject to clock feedthrough, leakage, and substrate crosstalk.

SUMMARY

According to one embodiment of the present disclosure, an analog front-end (AFE) circuit for conditioning a sensor signal. The AFE circuit includes a first stage configured to amplify and filter the sensor signal. The first stage comprises a biquadratic filter comprising a first plurality of DC-coupled transconductance amplifiers. The AFE further includes a second stage configured to further amplify and filter the amplified sensor signal, and to compensate a direct current (DC) offset of the first stage. The second stage comprises a second plurality of AC-coupled transconductance amplifiers. Each transconductance amplifier of the first plurality and of the second plurality has a programmable transconductance and comprises a plurality of subthreshold-biased transistors.

According to one embodiment of the present disclosure, a system for conditioning and detecting a sensor signal includes a multiplier circuit for performing a multiplication operation on the sensor signal to produce a multiplied sensor signal. The system further includes an analog front-end (AFE) circuit coupled to the multiplier circuit to produce a conditioned sensor signal from the multiplied sensor signal. The AFE includes a first stage configured to amplify and filter the sensor signal. The first stage comprises a biquadratic filter comprising a first plurality of DC-coupled transconductance amplifiers. The AFE further includes a second stage configured to further amplify and filter the amplified sensor signal, and to compensate a direct current (DC) offset of the first stage. The second stage comprises a second plurality of AC-coupled transconductance amplifiers. Each transconductance amplifier of the first plurality and of the second plurality has a programmable transconductance and comprises a plurality of subthreshold-biased transistors. The system further includes a detector circuit coupled to the AFE to determine a presence of the conditioned signal.

According to one embodiment of the present disclosure, a method for conditioning a sensor signal includes amplifying and filtering the sensor signal using a first stage of an analog front-end (AFE) circuit. The first stage comprises a biquadratic filter comprising a first plurality of DC-coupled transconductance amplifiers. The method further includes amplifying and filtering the sensor signal using a second stage of the AFE, the second stage comprising a second plurality of AC-coupled transconductance amplifiers. The method further includes compensating a direct current (DC) offset of the first stage using the second stage. Each transconductance amplifier of the first plurality and of the second plurality has a programmable transconductance and comprises a plurality of subthreshold-biased transistors.

BRIEF DESCRIPTION OF THE SEVERAL VIEWS OF THE DRAWINGS

FIGS. 4A-4C are circuit schematic diagrams of three types of conventional transconductance amplifiers.

DETAILED DESCRIPTION

Embodiments of the present disclosure are directed to an analog front-end (AFE) circuit for conditioning a sensor output signal. The AFE is divided into multiples of two circuit stages cascaded together in series to realize amplifier/ filters of any order. A first stage of the two circuit stages is configured to amplify and filter the sensor signal. The first stage includes a re-configurable biquadratic filter comprising a first plurality of DC-coupled transconductance amplifiers. A second stage of the two circuit stages is configured to further amplify and filter the sensor signal, and to compensate a direct current (DC) offset of the first stage. The second stage comprises a second plurality of AC-coupled transconductance amplifiers.

Implementations of the AFE circuit may consume low power, may have a low latency, and may have a low distortion, which are important for conditioning high dynamic range signals. Implementations of the AFE may have built-in self-calibration and automatic gain control circuitry. Implementations of the AFE may be scalable with current consumption. Parameters of the AFE filter and DC compensation circuit may be programmable, including the transconductance of the transconductance amplifiers, which in turn can alter the gain and frequency response of the biquadratic filter. The modular multiple stage design is reconfigurable for different types of sensor signal amplitudes, frequencies, and phases.

Figure 1:
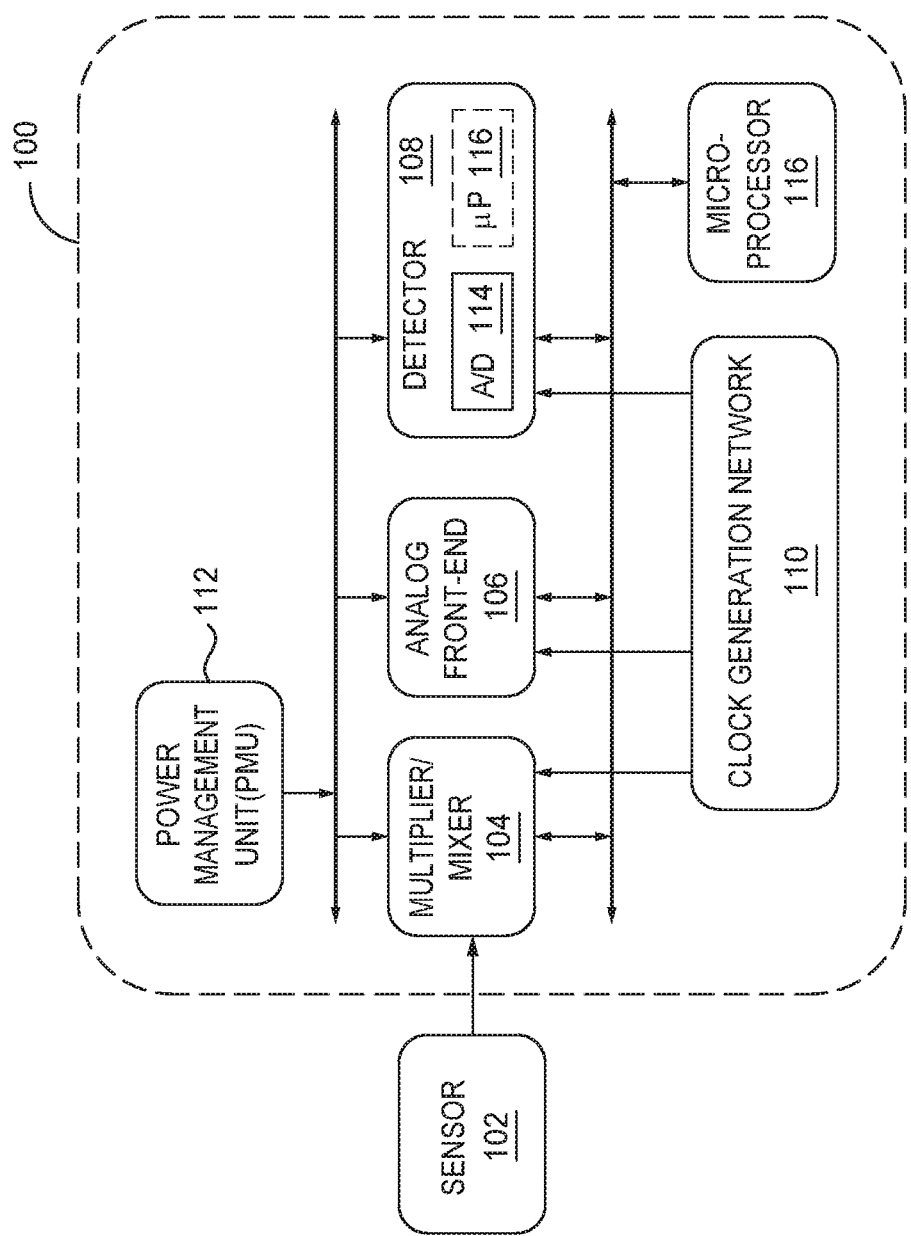
FIG. 1 is a block diagram of a system for conditioning and detecting a sensor signal output by a sensor.

FIG. 1 is a block diagram of a system 100 for conditioning and detecting a sensor signal output by a sensor 102. The system comprises a multiplier/mixer circuit 104, an AFE 106, a detector circuit 108, a clock generation network 110, and a power management unit 112. The multiplier/mixer circuit 104 is coupled to an output of the sensor 102. The output signal of the sensor 102 may be a current, a voltage, or an optical signal that is converted to a current or voltage by an optical-to-electrical transducer (not shown). The multiplier circuit 104 is configured to perform a scalar or a vector multiplication operation on the sensor output signal. The scalar multiplication operation of the multiplier circuit 104 scales the sensor output signal by a real number quantity. This scaling factor may be a value less than or equal to one for scaling the transduced output voltage or current received from the sensor 102 to within a dynamic range of the AFE 106 when the sensor output signal has a large dynamic range. When the sensor output signal is a low frequency baseband signal that is modulated by a high frequency carrier signal, the multiplier circuit 104 can act as a mixer circuit, which, when used in conjunction with a filter implemented in the AFE 106, can extract the baseband signal from the carrier signal. When the sensor output signal does not need to be scaled or mixed, the multiplier circuit 104 can be bypassed and the sensor output signal may be coupled directly to the AFE 106. The AFE 106 is configured to condition the sensor output signal by providing gain and filtering to the sensor output signal using one or more biquadratic filters, and to provide one or more DC offset compensation circuits to nullify DC offset of a preceding biquadratic filter circuit. The one or more biquadratic filters and the one or more DC offset compensation circuits are constructed from pluralities of series-connected transconductance amplifiers.

The AFE 106 is coupled to a detector circuit 108 to determine the presence of the conditioned sensor signal output by the AFE 106. In one embodiment, the detector circuit 108 may directly detect the conditioned sensor signal, e.g., using a threshold detector circuit. In another embodiment, the detector circuit 108 may digitize the conditioned sensor signal using an analog-to-digital (A/D) converter 114. The digitized conditioned sensor signal is detected and processed by a microprocessor 116. The microprocessor may be included in the detector circuit 108, or may stand on its own when the detector circuit 108 is a direct detector of the conditioned sensor signal. The microprocessor 116 further provides programmable I/O to provide digital values to program parameters of each of the transconductance amplifiers and to set the scalar and vector values of the multiplier circuit 104. The microprocessor 116 further provides programmable I/O to operate the A/D converter 114, the clock generator network 110, and the power management unit 112. The clock generation network 110 provides clock signals to the multiplier circuit 104, the AFE 106, and the detector circuit 108. The power management unit 112 provides and controls the power consumed by the multiplier circuit 104, the AFE 106, and the detector circuit 108.

Figure 2:
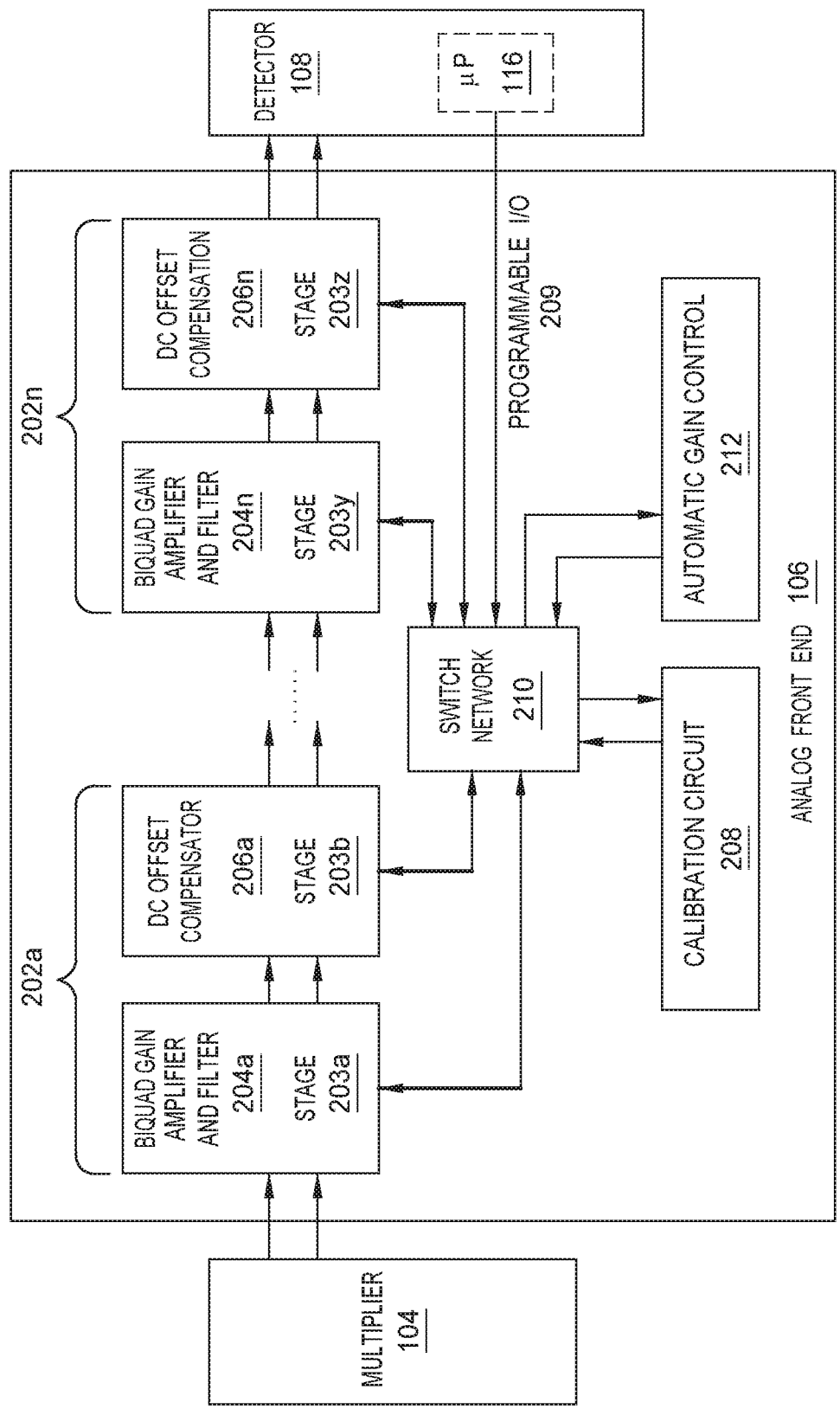
FIG. 2 is a block diagram of an analog front-end circuit (AFE) of the system.

FIG. 2 is a block diagram of the AFE 106. The AFE 106 comprises one or more pairs 202a-202n of stages 203a-203z, where each pair 202a-202n of stages 203a-203z, includes one of a plurality of DC-coupled biquadratic filters 204a-204n followed in series by one of a plurality of AC-coupled DC offset compensation circuits 206a-206n. Each of the biquadratic filters 204a-204n is configured to provide gain and filtering to the sensor output signal received from the multiplier circuit 104. Each of the AC-coupled offset compensation circuits 206a-206n is configured to provide further amplification and gain and to remove DC offset from its immediately preceding one of the series-connected biquadratic filters 204a-204n. Each of the plurality of DC-coupled biquadratic filters 204a-204n and each of the plurality of AC-coupled DC offset compensation circuits 206a-206n are reconfigurable.

In some embodiments, a first stage 203a (e.g., the biquadratic filter 204a of the pair 202a) is configured to amplify and filter a received sensor signal. The first stage 203a comprises a first plurality of DC-coupled transconductance amplifiers. A second stage 203b (e.g., the DC offset compensation circuit 206a of the pair 202a) is configured to receive the amplified sensor signal, to further amplify and filter the amplified sensor signal, and to compensate a direct current (DC) offset of the first stage 203a. The second stage 203b comprises a second plurality of AC-coupled transconductance amplifiers. Each transconductance amplifier of the first stage 203a and the second stage 203b have a programmable transconductance and comprises a plurality of subthreshold-biased transistors. A subthreshold-biased transistor refers to a quiescent current of the transistor being selected such that an input gate to source DC voltage of the transistor is close to, but slightly less than the transistor threshold voltage ($V_T$). Accordingly, the transconductance ($G_m$) of the transistor is given by $G_m = I/V_T$, where I is the quiescent current (e.g., typically on the order of tens or hundreds of nanoamperes (nA)), and $V_T$ is the thermal voltage, defined as $V_T = kT/q$, where k is the Boltzmann constant, T is the absolute temperature, and q is the charge of an electron.

Although shown as having differential inputs and outputs, the biquadratic filters 204a-204n and the DC offset compensation circuits 206a-206n may also be implemented as single ended stages. By cascading multiple pairs 202a-202n of alternating stages 203a-203z of biquadratic filters 204a-204n and DC offset compensation circuits 206a-206n, any order of low pass/bandpass filter or combination thereof may be realized.

The AFE 106 is further configured to implement automatic gain control of the biquadratic filters 204a-204n and the DC offset compensation circuits 206a-206n with an automatic gain control circuit 212 under the control of the microprocessor 116. The automatic gain control circuit 212 comprises a combination of analog and digital circuitry. The analog and digital circuitry are operated by the microprocessor 116 in the detector circuit 108 using programmable I/O 209 from the microprocessor 116 that select one or more switches within a switch network 210 to program the automatic gain control circuit 212 to set a gain of one or more of the biquadratic filters 204a-204n and the DC offset compensation circuits 206a-206n. The analog circuitry detects signals output by the biquadratic filters 204a-204n and the DC offset compensation circuits 206a-206n, and digital circuitry selects one or more change in gain signals and feeds back these signals to one or more of the biquadratic filters 204a-204n and the DC offset compensation circuits 206a-206n using the switch network 210 to change the gain of the one or more of the biquadratic filters 204a-204n and the DC offset compensation circuits 206a-206n.

The switch network 210 further receives output signals from the detector circuit 108 to open/close one or more switches that control bias currents in the transconductance amplifiers making up the biquadratic filters 204a-204n and the DC offset compensation circuits 206a-206n. At least one of a gain of the biquadratic filter, a quality factor (Q) of the biquadratic filter, and a frequency response of the biquadratic filter is programmable by adjusting the bias currents of the transconductance amplifiers.

The AFE 106 is further configured to implement calibration of individual ones of the biquadratic filters 204a-204n and the DC offset compensation circuits 206a-206n or a full path through a subset or the entire set of biquadratic filters 204a-204n and DC offset compensation circuits 206a-206n using a calibration circuit 208 under the control of the microprocessor 116. Calibration may be performed using a combination of hardware implemented in the calibration circuit 208 and software implemented in the microprocessor 116. The calibration circuit 208 comprises simulated sensor signal circuitry, an amplitude detector, and a phase detector, and can include the A/D converter 114. The goal of calibration is for the microprocessor 116 to render decision to correct/adjust circuit parameters of the biquadratic filters 204a-204n and DC offset compensation circuits 206a-206n so that the biquadratic filters 204a-204n and DC offset compensation circuits 206a-206n operate within design and performance specifications and to optimize power consumption. A set of sensor-simulated stimuli signals are applied to one or more of the biquadratic filters 204a-204n and DC offset compensation circuits 206a-206n and a calibration function is constructed by the microprocessor 116. A conditioned sensor signal representing the calibration function is measured by the calibration circuit 208 and a decision is made by the microprocessor 116 regarding whether the one or more of the biquadratic filters 204a-204n and DC offset compensation circuits 206a-206n are performing optimally. If a stage 203a (e.g., the biquadratic filter 204a) is performing optimally, then no circuit parameters are adjusted in the stage 203a (e.g., the biquadratic filter 204a). However, when performance of the stage 203a (e.g., the biquadratic filter 204a) deviates by a predetermined amount from the constructed calibration function, then circuit parameters of the stage 203a (e.g., the biquadratic filter 204a) are adjusted to optimize performance.

Calibration of the biquadratic filters 204a-204n and DC offset compensation circuits 206a-206n may be performed concurrently. Concurrent calibration means that the calibration can occur while the biquadratic filters 204a-204n and DC offset compensation circuits 206a-206n are processing sensor signals. The biquadratic filters 204a-204n and DC offset compensation circuits 206a-206n can receive/process the sensor signal, while the calibration path can be activated simultaneously.

Figure 3A:
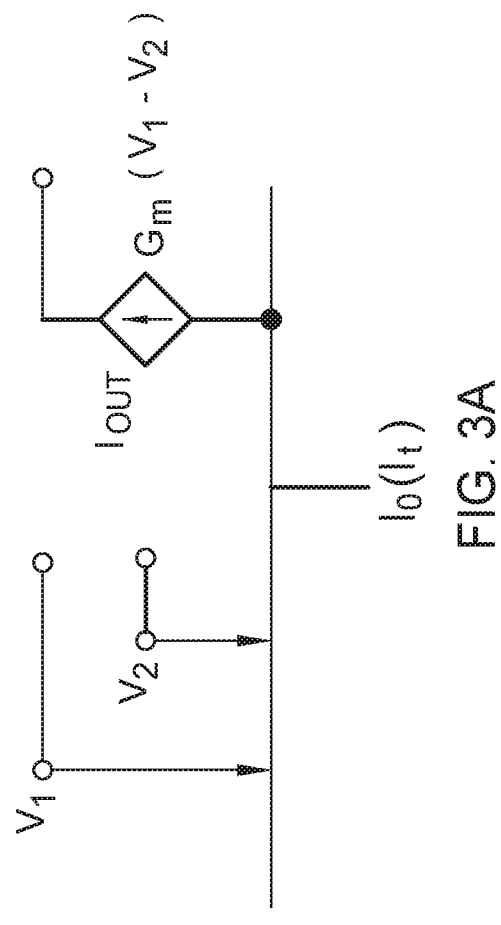
FIG. 3A is an equivalent ideal circuit model of an operational transconductance amplifier (OTA).

FIG. 3A is an equivalent circuit model of an operational transconductance amplifier (OTA) (hereinafter "transconductance amplifier"). An OTA is an amplifier whose differential input voltage produces an output current. Thus, the OTA is a voltage controlled current source (VCCS). The OTA is similar to a standard operational amplifier in that it has a high impedance differential input stage and that it may be used with negative feedback, but the OTA's output is a current as opposed to a voltage for a standard operational amplifier. In an ideal OTA, the output current is a linear function of the differential input voltage, where $V_1$ is the voltage at the non-inverting input, $V_2$ is the voltage at the inverting input and $G_m$ is the transconductance of the amplifier. The OTA's output current is given as $I_{out}=G_m (V_1-V_2)$. The output of the OTA can be converted to a voltage by loading the OTA's output with an impedance. Accordingly, the OTA's output voltage is the product of its output current and its load impedance. The voltage gain is then the output voltage divided by the differential input voltage. The transconductance of the OTA is usually controlled by an input current, denoted $I_o$ ("bias current" or "tail current"). The amplifier's transconductance is directly proportional to $I_o$. Since $I_o$ can be changed to a greater or lower value, $G_m$ can be scaled by a greater or lower value and is thus amenable to being programmed by changing the value of $I_o$, e.g., by operating one or more switches in the switch network 210 of FIG. 2 that are coupled to transistors making up the transconductance amplifier under the control of the programmable I/O 209 of the microprocessor 116 (see FIGS. 7 and 8).

Figure 3B:
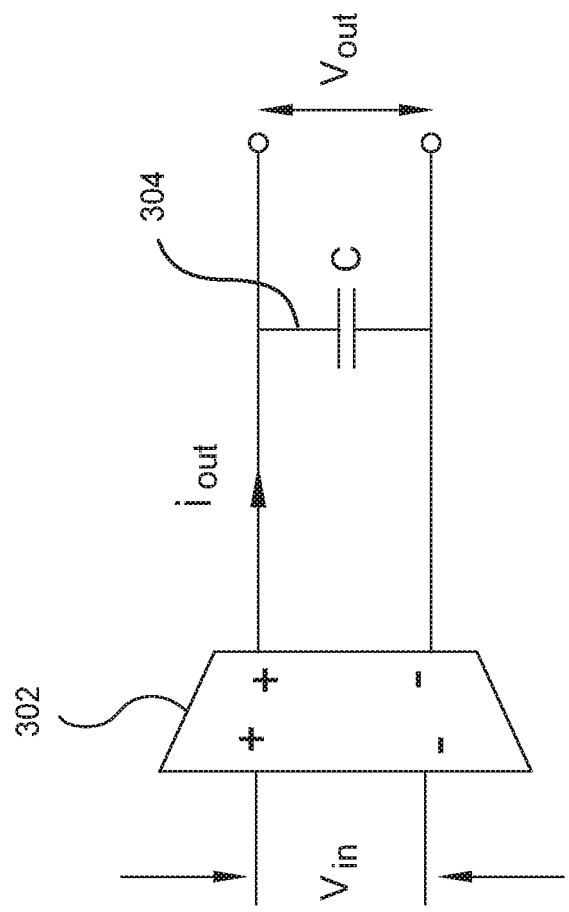
FIG. 3B is a circuit schematic diagram of a transconductance-capacitance (Gm-C) filter.

FIG. 3B is a circuit schematic diagram of a transconductance-capacitance (Gm-C) filter. A Gm-C filter can be constructed by loading the output of a transconductance amplifier 302 with a capacitor C (304). The input (voltage) is $V_{in}$, and output voltage $V_{out}$ is the output current $i_{out}$ multiplied by the impedance of the capacitor 304. In this configuration, $|V_{out}/V_{in}|=Gm/wC$, where w is the angular frequency. The Gm-C filter realizes an integrator.

Figure 4B:
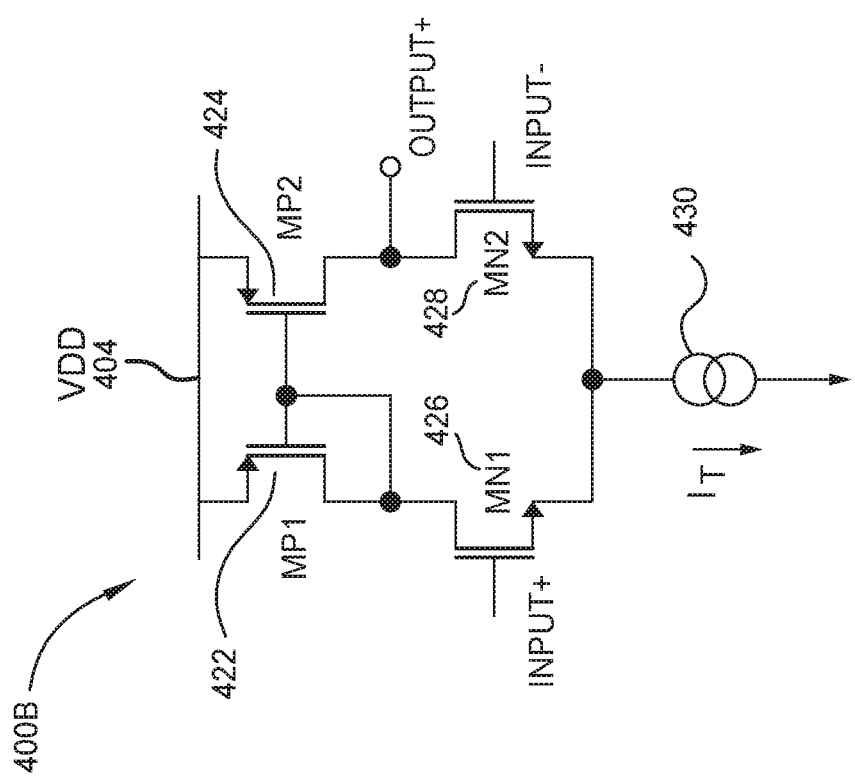
Figure 4C:
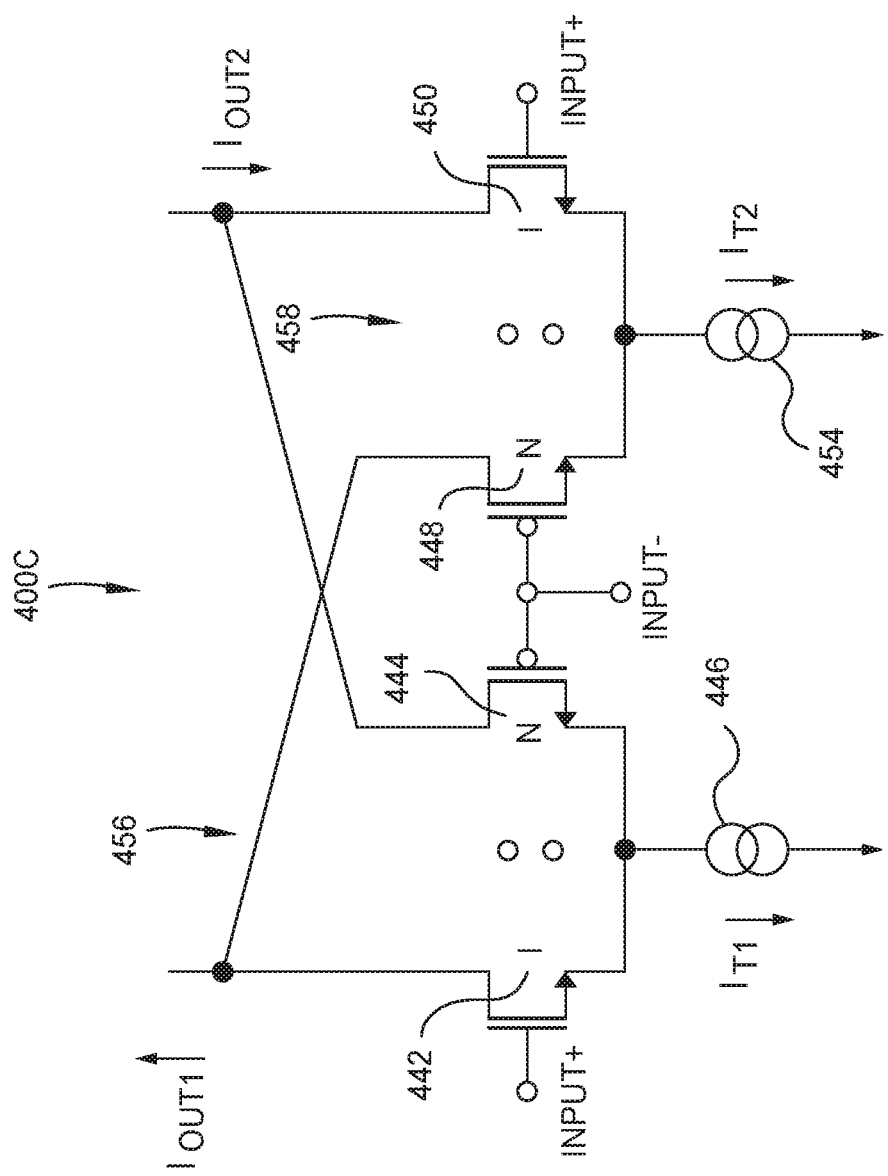

FIGS. 4A-4C are circuit schematic diagrams of three types of transconductance amplifiers 400a, 400b, 400c. The biquadratic filters 204a-204n and the DC offset compensation circuits 206a-206n of the AFE 106 can be implemented using any one or a combination of the transconductance amplifiers 400a, 400b, 400c. In FIG. 4A, a fully differential transconductance amplifier 400a is shown. The fully differential transconductance amplifier 400a includes PFET transistor MP1 (402) having a drain terminal connected to a power supply rail $V_{DD}$ (404), a source terminal connected to a source terminal of an NFET transistor MN1 (406), and a gate terminal connected to a gate terminal of a second PFET transistor MP2 (410). The drain terminal of the PFET 410 is connected to the power supply rail $V_{DD}$ (404), while the source terminal of PFET 410 is connected to the source terminal of a second NFET transistor MN2 (408). The drain terminals of the NFET transistors 406, 408 are connected to each other and to a current source $I_t$ (corresponding to Io of the transconductance amplifier of FIG. 3A), which represents the bias or tail current of the transconductance amplifier 400a and is proportional to the transconductance of the transconductance amplifier 400a. A common-mode feedback (CMFB) circuit 414, which may be realized using passive or active components is connected to the gate terminals of PFETs 402, 410 and to corresponding source terminals of the PFETs 402, 410. The differential inputs (Input+ and Input−) are the gate terminals of the NFET transistors 406, 408. The differential outputs (Output+, Output−) are the source terminals of the NFET transistors 406, 408.

In FIG. 4B, a differential-input/single-ended output transconductance amplifier 400b is shown. The differential-input/single-ended output transconductance amplifier 400b includes PFET transistor MP1 (422) having a drain terminal connected to a power supply rail $V_{DD}$ (404), a source terminal connected to a source terminal of an NFET transistor MN1 (426) and the gate terminal of 422, the gate terminal connected to a gate terminal of a second PFET transistor MP2 (424). The drain terminal of PFET transistor 422 is connected to the power rail $V_{DD}$, while the source terminal of PFET transistor 424 is connected to the source terminal of a second NFET transistor MN2 (428). The drain terminals of NFET transistors 426, 428 are connected to each other and to a current source $I_t$, which represents the bias or tail current of the transconductance amplifier 400b. The differential inputs (Input+ and Input−) are the gate terminals of the NFET transistors 426, 428. The single ended output (Output+ is the source terminals of the NFET transistor 428.

In FIG. 4C, a second fully differential transconductance amplifier 400c is shown. The transconductance $G_m$ of the transconductance amplifier 400c is the sum of two transconductances $G_{m1}$ and $G_{m2}$ of its two stages 456, 458 and is correspondingly proportional to the tail currents $I_{t1}$ and $I_{t2}$ of its two stages 456, 458. The first stage 456 of the transconductance amplifier 400c includes a first NFET transistor 442 having a drain terminal connected to a first current source 446 having the tail current Iii and connected to a drain terminal of a second NFET 444. The aspect ratio of the second NFET transistor 444 to the first NFET transistor 442 is N:1 where N is an integer greater than or equal to 1. The second stage 458 of the transconductance amplifier 400c comprises a third NFET transistor 448 whose drain terminal is connected to a drain terminal of a fourth NFET transistor 450 and to a second current source 454 having the tail current $I_{t2}$. The gates of the second NFET transistor 444 and the third NFET transistor 448 are connected to each other. The source terminal of the first NFET 442 transistor is fed back to the source terminal of the third NFET transistor 448 and the source terminal of the second NFET 444 is fed back to the source terminal of the fourth NFET transistor 450. The aspect ratio of the third NFET transistor 448 to the fourth NFET transistor 450 is N:1. The differential inputs (Input+ and Input−) are the gate terminals of the NFET transistors 442, 444, 448, 450. The differential outputs (Iout1−, Iout2) are currents entering the terminals of NFET transistors 442, 448 and the source terminals of the NFET transistors 444, 450.

Figure 5:
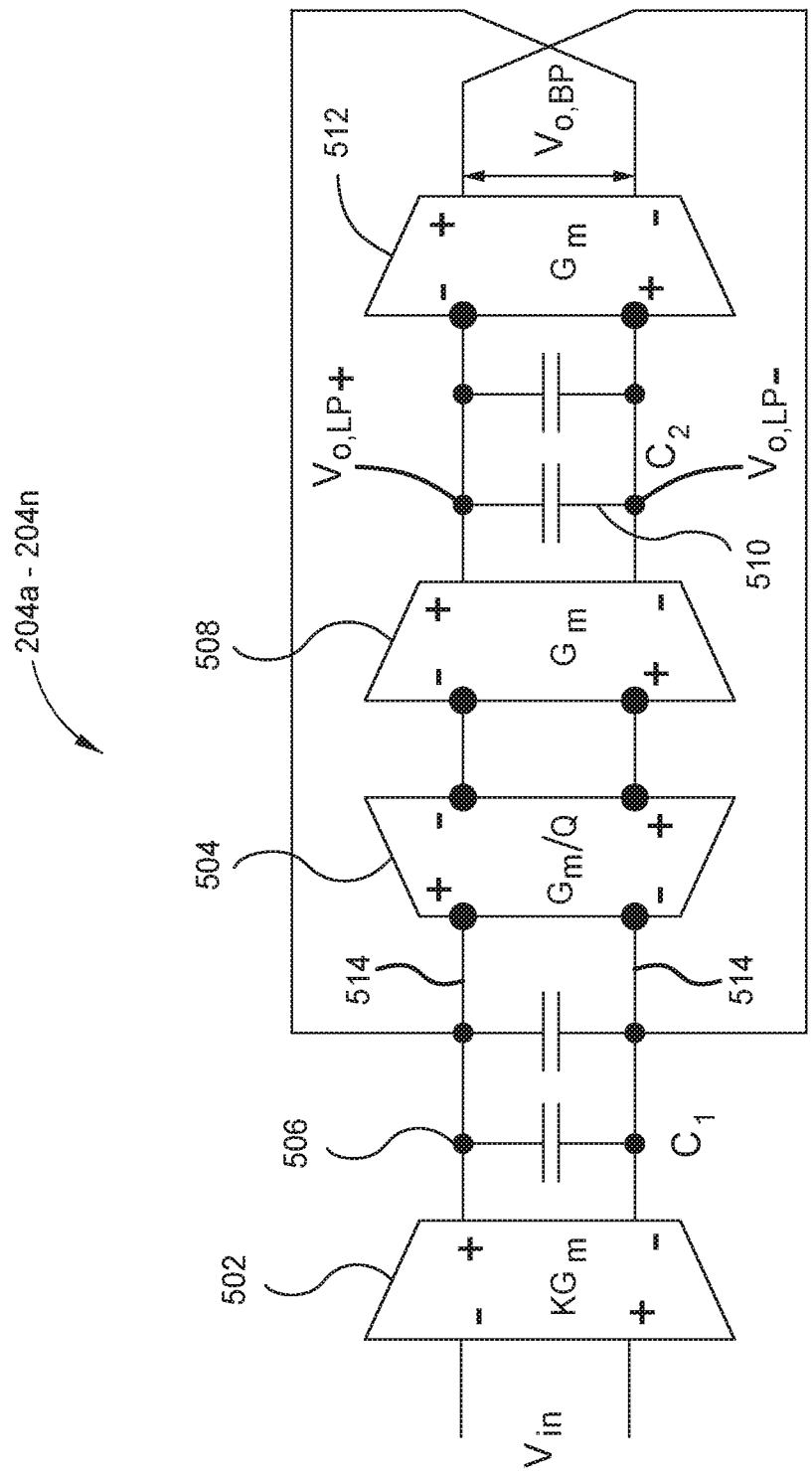
FIG. 5 is a circuit schematic diagram of one embodiment of the DC-coupled biquadratic filter configured in a differential mode of operation.

FIG. 5 is a circuit schematic diagram of one embodiment of the DC-coupled biquadratic filter 204a-204n configured in a differential mode of operation. In another embodiment, the biquadratic filter 204a-204n may be configured in a single-ended mode. As used herein, a biquadratic filter is a type of linear filter that implements a transfer function that is the ratio of two quadratic functions. The biquadratic filter 204a-204n is further configured as a Tow-Thomas biquad (TTBQ) filter. A TTBQ filter has a biquadratic transfer function shown below in Equations 1-3:

$$V_{O,BP} = \left[ -KGmv_{in} - V_{O,BP}\left(\frac{G_m}{Q}\right)V_{O,BP}\left(\frac{G_m}{sC_2}\right)G_m\right]\left(\frac{1}{sC_1}\right) \quad (1)$$

$$V_{O,BP} = \frac{-K\left(\frac{C_2}{G_m}\right)sv_{in}}{\left(1 + \left(\frac{C_2}{QG_m}\right)s + \left(\frac{C_1 C_2}{G_m^2}\right)s^2\right)} \quad (2)$$

$$V_{O,LP} = \frac{Kv_{in}}{\left(1 + \left(\frac{C_2}{QG_m}\right)s + \left(\frac{C_1 C_2}{G_m^2}\right)s^2\right)} \quad (3)$$

Each of the biquadratic filters 204a-204n comprises a set of series-connected transconductance amplifiers 502, 504, 508, 512. The transconductance amplifier 502 provides gain and filtering. The transconductance amplifier 502 has a gain increase over $G_m$ of $KG_m$, wherein K is a real value greater than or equal to 1 and $G_m$ is the transconductance of the transconductance amplifier 502. The outputs of the transconductance amplifier 502 are loaded with a capacitor $C_1$ connected in parallel across the outputs of the transconductance amplifier 502. The transconductance amplifier 502 loaded with the capacitor $C_1$ produces a first transconductance-capacitance ($G_m$-C) filter. The outputs of the transconductance amplifier 502 are coupled in series with the transconductance amplifier 504 having a decrease increase under $G_m$ of $G_m/Q$, wherein Q is a real value greater than or equal to 1. The outputs of the transconductance amplifier 504 are coupled in series with the transconductance amplifier 508 having a gain equal to the transconductance $G_m$. The transconductance amplifier 508 provides filtering. The outputs of the transconductance amplifier 508 are loaded with a capacitor $C_2$ connected in parallel across the outputs of the transconductance amplifier 508. The transconductance amplifier 508 loaded with the capacitor $C_2$ produces a second transconductance-capacitance (Gm-C) filter. The outputs of the transconductance amplifier 508 are coupled in series with the transconductance amplifier 512 having a gain of $G_m$. The outputs of the transconductance amplifier 512 are cross-fed in negative feedback to a summing node 514 at the inputs of transconductance amplifier 504.

In this configuration, the biquadratic filter 204a-204n is configured both as a low pass filter at the outputs labeled $V_{o, LP}$ ($V_{o, LP+}$, $V_{o, LP-}$) of transconductance amplifier 508 and as a band-pass filter at the outputs labeled $V_{o, BP}$ of transconductance amplifier 512.

More particularly, in order to realize a biquadratic filtering functionality, the transconductance amplifiers 502, 508 are loaded with capacitive elements to realize integrator functions, which each have a transfer function of the form $G_m/sC$. Two such integrators may be cascaded in series realize double integrator functionality having a transfer function of the form $KG_m^2/s^2C^2$. The proportional first integrator and the second integrator each have outputs that are added in current mode to obtain a biquadratic transfer function. The biquadratic transfer function, derived above with respect to Equations 1-3 has the properties of independent adjustment of gain, center frequency, and quality factor. Poles and zeros are typically a function of $G_m/C$, and after changing $G_m$ digitally to change the gain of the biquadratic filter (e.g., 204a), C ($C_1$, $C_2$) can also be programmed digitally, which, in conjunction with programming $G_m$, can change the corner frequencies of the resulting low pass and band-pass filters. The scaling factors in transconductance elements 502, 504, 508, 512, biased in the subthreshold region of their constituent transistors, are realized by scaling bias currents of the transconductance amplifiers 502, 504, 508, 512. The bias currents of the transconductance amplifiers 502, 504, 508, 512 are scaled by operating one or more switches in the switch network 210 which receive code words constructed by programmable I/O 209 received from the microprocessor 116 to enable/disable inputs of the switches that constitute the switch network 210.

In an embodiment, the biquadratic filter 204a-204n is convertible to a single pole $G_m$-C filter by turning off a quiescent current of one of the two $G_m$-C filters. By selectively powering down various ones of the transconductance amplifiers 502, 504, 508, 512 by setting respective bias currents to zero, the frequency response, quality factor, and the gain of the biquadratic filter $204_a$-$204_n$ can be changed. Accordingly, each of the biquadratic filters 204a-204n is reconfigurable.

Figure 6:
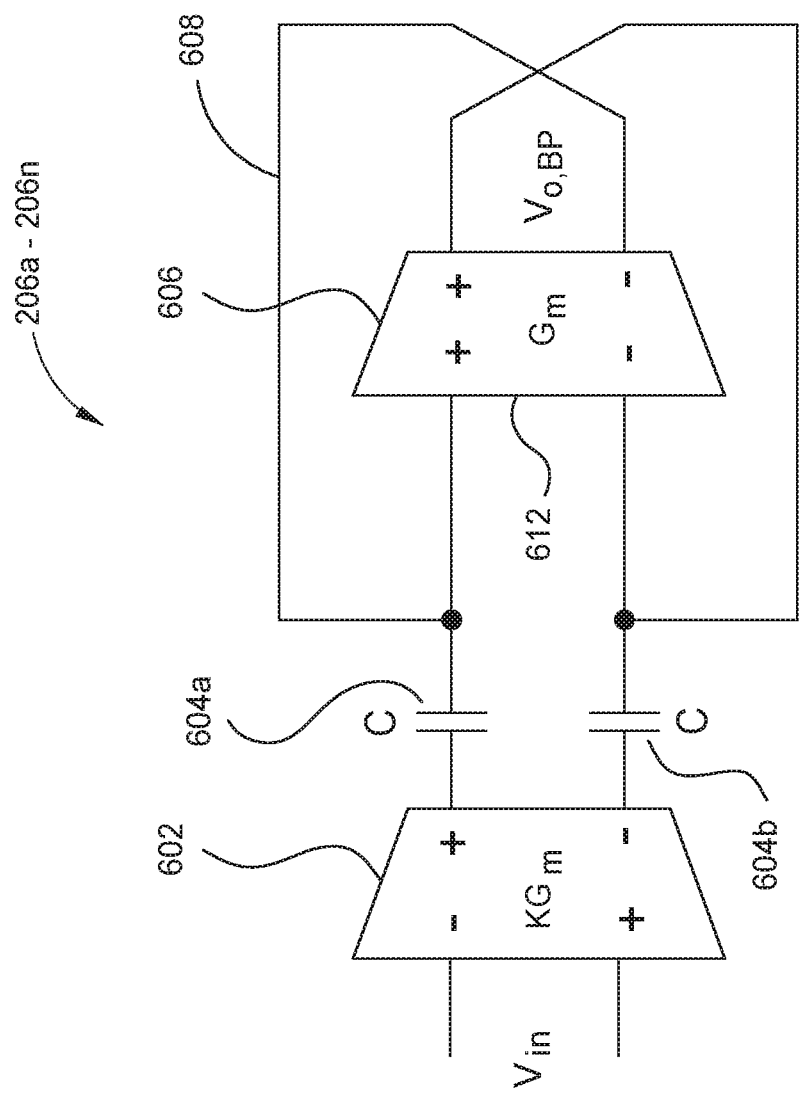
FIG. 6 is a circuit schematic diagram of one embodiment of the AC-coupled DC offset compensation circuit configured in a differential mode of operation.

FIG. 6 is a circuit schematic diagram of one embodiment of the AC-coupled DC offset compensation circuit 206a-206n configured in a differential mode of operation. In another embodiment, the DC offset compensation circuit 206a-206n may be configured in a single-ended mode. The DC offset compensation circuit 206a-206n comprises a pair of series-connected transconductance amplifiers 602, 606. The transconductance amplifier 602 provides gain and filtering. The transconductance amplifier 602 has a gain of $KG_m$, wherein K is a real value greater than or equal to 1. The outputs of the transconductance amplifier 602 are AC-coupled in series with a pair of DC blocking capacitors C (604a, 604b). The pair of DC blocking capacitors 604a, 604n are also coupled in series with inputs 612 of the transconductance amplifier 606 having a gain equal to transconductance $G_m$. The outputs 608 of the transconductance amplifier 606 are cross-fed with negative feedback to the inputs 612 of transconductance amplifier 606.

The transfer function of the DC offset compensation circuit 206a-206n is as follows:

$$V_o = KG_m\left(\frac{r_{out}}{\frac{2}{G_m} + \frac{1}{sC + r_{out}}}\right)\frac{2}{G_m}(-V_{in}) \qquad (4)$$

$$\frac{V_o}{V_{in}} = -2KGm\left(\frac{scr_{out}}{\frac{2}{G_m} + \frac{1}{\frac{1}{sC} + r_{out} + G_m}}\right) \qquad (5)$$

$$\omega_{z_1} = 0 \qquad (6)$$

$$\omega_{p_1} = -\frac{G_m}{(2 + G_m r_{out})C} \qquad (7)$$

Where rout is the parasitic output impedance of the transconductance amplifier 602, $\omega_{z_1}$ is the zero of the transfer function in Equation 5, and $\omega_{p_1}$ is a pole of the transfer function in Equation 5. Since the zero in the numerator in Equation 5 is zero, then the transfer function goes to zero at DC. Since gain goes to zero at DC, the DC offset voltage of the immediately preceding biquadratic filter stage is cancelled. Gain $KG_m$ is provided at non-zero frequencies. Equation 5 further indicates that filtering is provided to all frequencies.

Figure 7:
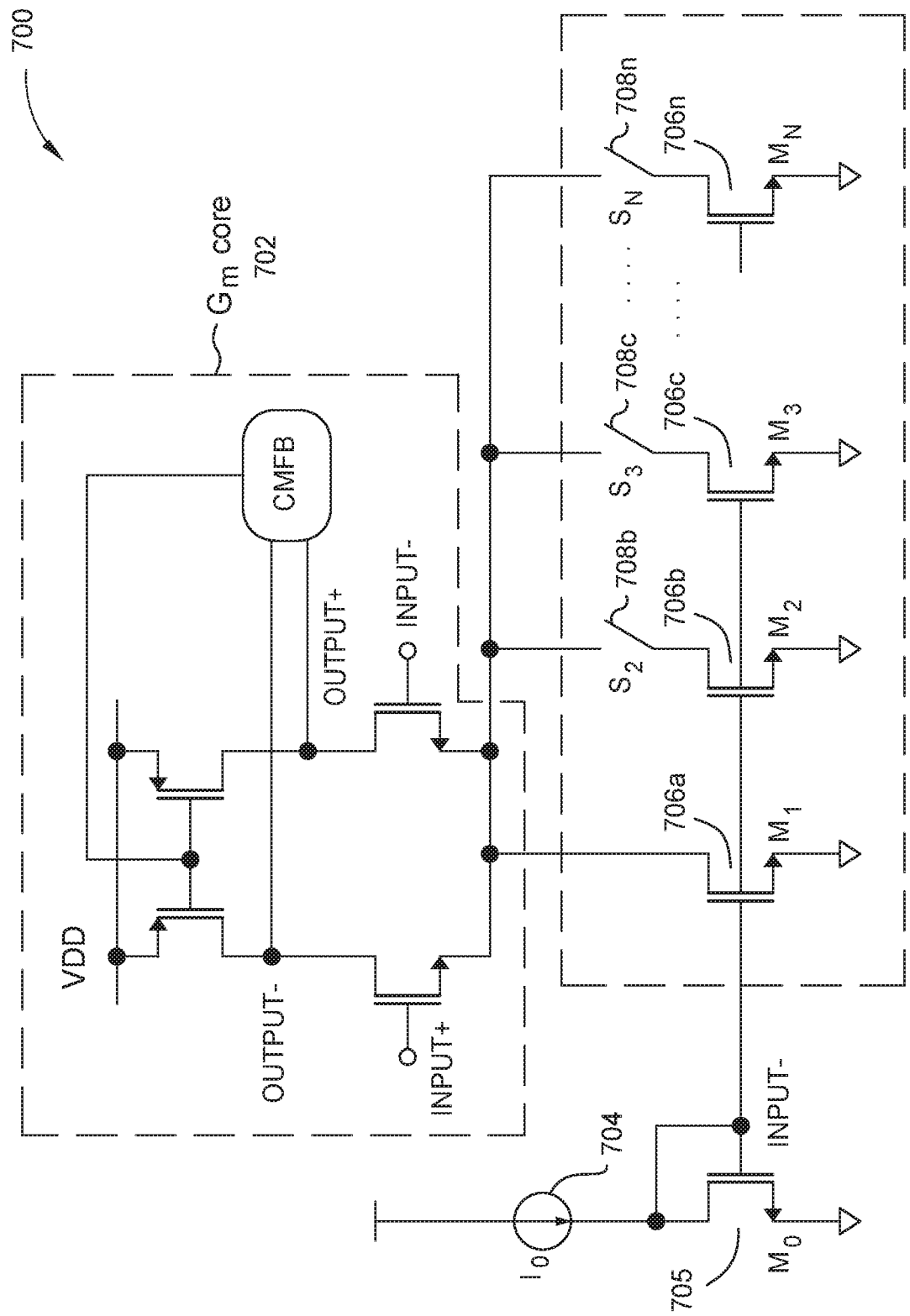
FIG. 7 is an electrical schematic diagram of transconductance amplifier used to implement the stages and modified to program transconductance gain values.

FIG. 7 is an electrical schematic diagram of transconductance amplifier 700 used to implement the biquadratic filters 204a-204n and the DC offset compensation circuits 206a-206n and modified to program transconductance gain values to values greater than $G_m$ (e.g., program the transconductance $G_m$). In one embodiment, changing the tail current or bias current of the transconductance amplifier 700 provides for different transconductance values. The transconductance amplifier 700 includes a transconductance circuit core 702 (see FIG. 4A), a current source $I_o$ (704), an array of current sources comprising NFET transistors 705 and 706a-706n ($M_o$-$M_n$), and a plurality of switches 708a-708n ($S_2$-$S_n$) taken from the switch network 210. The current source 704 has an output connected to the source terminal of the NFET transistor 705. The gates of all of the NFET transistors 706a-706n ($M_1$-$M_n$) are coupled to each other, the source terminals of the NFET transistors 705 and 706b-706n ($M_o$-$M_n$) are tied to ground potential, and the source terminals of the NFET transistors 706b-706n ($M_o$-$M_n$) are coupled to corresponding ones of the switches 708b-708n (S2-Sn). The switches 708b-708n ($S_2$-$S_n$) are further coupled to a common bias terminal 710 of the transconductance circuit core 702 (e.g., the source terminal of NFET transistor 706a is directly coupled to common bias terminal 710). By operating one or more of the switches 708a-708n ($S_1$-$S_n$e) under the control of the programmable I/O 209 of the microprocessor 116, multiples of the value of the current Io bias the transconductance circuit core 702.

Assuming that the transistors $M_1$-$M_n$ have an aspect ratio of $w_1$, where "i" denotes a specific transistor, e.g., $w_2$ for $M_2$, etc., if $S_2$ and $S_3$ are operated, the total current biasing the transconductance circuit core 702 is:

$$\text{I\_tail} = I_o\left(\frac{w_1 + w_2 + w_3}{w_o}\right). \qquad (8)$$

By selecting certain combinations of the switches $708_a$-$708_n$ (S1-Sn), one can obtain Gm and higher values of gain $KG_m$.

Figure 8:
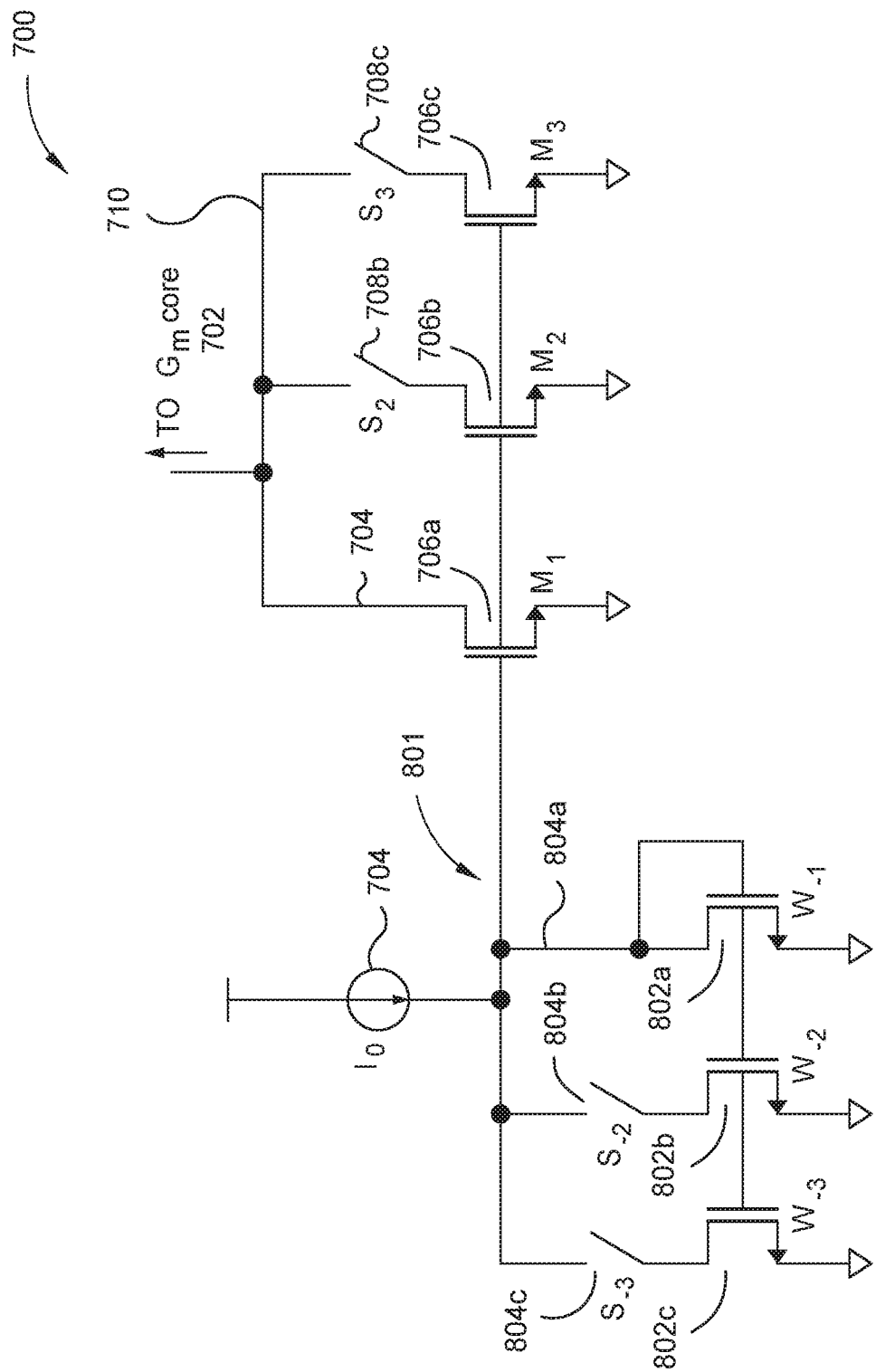
FIG. 8 is an electrical schematic diagram of a transconductance amplifier used to implement the stages and modified to provide a scaling factor for further programming program transconductance values.

FIG. 8 is an electrical schematic diagram of transconductance amplifier 700 used to implement the biquadratic filters 204a-204n and the DC offset compensation circuits 206a-206n and modified to provide a scaling factor less than $G_m$ for further programming transconductance values of the transconductance circuit core 702. The NFET transistors 705 tied to the current source 704 has been replaced by scaling network 801. Scaling network 801 includes NFET transistors 802a-802c having aspect ratios of $w_{-1}$ to $w_{-3}$ and switches 804a-804c taken from the switch network 210. The drain terminals of NFET transistors 802a-802n are tied to ground potential. The gate terminals of NFET transistors 802a-802n are coupled to each other, to the source terminal of NFET transistor 802a, and to the gate terminals of NFET transistors 706a-706c. The source terminals of NFET transistors 802a-802n are coupled to corresponding ones of switches 804a-804c. The switches 804a-804c are also coupled to the current source Io (704).

The scaling factor for the scaling network 801 is:

$$\text{I\_tail} = I_o\left(\frac{w_1}{w_{-1} + w_{-2} + w_{-3}}\right).$$

$G_m$ is proportional to the total applied current I_tail when the transistors of the transconductance circuit core 702 are operating in a subthreshold region. If a lower $G_m$ is needed, less bias current is needed, and vice versa for a higher $G_m$. $G_m/Q$ can be realized using a lower value of current than Io based on equation (9). By operating one or more of the switches 804a-804c under the control of the programmable I/O 209 of the microprocessor 116, different values of the current Io bias the transconductance circuit core 702 and thus values of gain lower than $G_m$ (e.g., $G_m/Q$) can be obtained.

Accordingly, by programming the value of I_tail, each of the transconductance circuit cores 702 making up the biquadratic filters 204a-204n and the DC-offset compensation circuits 206a-206n is reconfigurable.

Figure 9A:
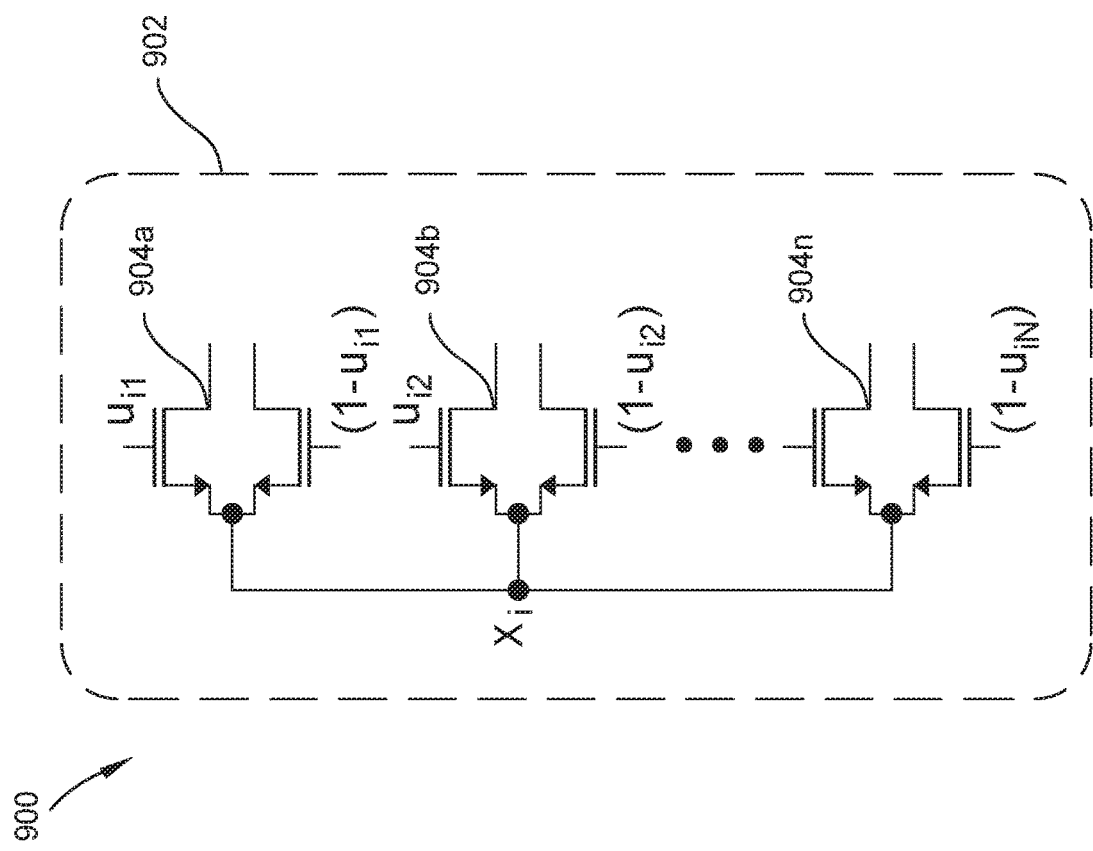
FIGS. 9A-9B are schematic block diagrams of a multiplier circuit configured to perform a scalar or a vector multiplication operation on the sensor output.
Figure 9B:
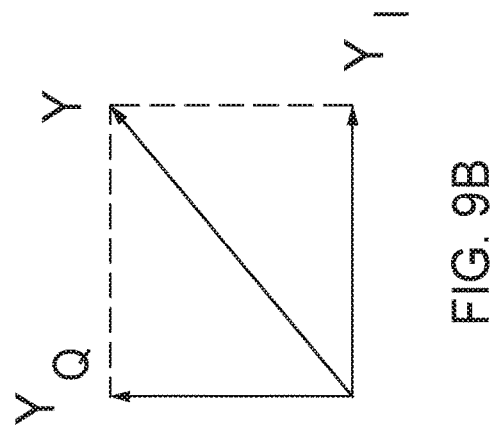

FIGS. 9A and 9B are schematic block diagrams of the multiplier circuit 104 configured to perform a scalar or a vector multiplication operation on the sensor output signal. The multiplier circuit 104 can be configured as a current multiplier or a voltage multiplier. As a current multiplier, the outputs of the multiplier circuit 104 are coupled to a low impedance node, while as a voltage mode multiplier, the outputs of the multiplier circuit 104 are coupled to a high impedance node. High impedance is typically above 500 ohms, and low impedance typically below 50 ohms. The multiplier circuit 104 is programmable by selecting a certain number of units 904a-904n using the programmable I/O 209 under the control of the microprocessor 116. The multiplication operation is one of scalar multiplication or vector multiplication with a phase shift (i.e., operation as a mixer).

The multiplier circuit 104 comprises N number of multiplying units 904a-904n, wherein K elements out of N elements are digitally and simultaneously selectable. N multiplying units 904a-904n feed fractions of a current or voltage applied to input $x_i$ from the sensor output signal to the AFE 106 by digitally operating certain ones of the gate terminals $u_{i1}$ or $1-u_{i1}$, $u_{i2}$ or $1-u_{i2}$, to $u_{iN}$ or $1-u_{iN}$ For scalar multiplication, K units out of N are set wherein $u_i=1$ and (N-K) units out of N, $u_i=0$ are not set. This produces a scaling factor of K/N, wherein K and N are both integers, K is less than or equal to N, and N is at least 1.

However, when directional information is desired, a vector multiplication is needed (the multiplier circuit 104 scales amplitude and provides an angle of direction). To obtain a vector multiplication, the multiplier circuit 104 comprises two scalar multipliers performing scalar multiplications that are out of phase (using quadrature clocks). The first multiplier operates K out of N units with a phase of 0 degree, while the second out-of-phase multiplier operates M out of P units with a phase of 90 degrees. If K out of N units are ON in the 0 degree phase multiplier and M out of P are ON for the 90 degree phase multiplier, then the scaling factor is $[\sqrt{\{(K/N)^2+(M/P)^2\}}]$, and the angle θ is given by atan[(K/N)/(M/P)]. P is not a delay, but simply the number of unit cells representing the quadrature phase.

In operation, K elements out of N element are enabled wherein Ui=1 and (N-K) elements are disabled out of N wherein Ui=0 for amplitude scaling. To obtain a phase delay of θ, P units of M are set with Ui=1 and (M-P) units out of N are not set where Ui=0. Ui and uj are delayed from each other by θ, where:

$$YI = \frac{K}{N} + \frac{M}{P}\cos(\theta) \quad (10)$$

$$YQ = \frac{M}{P}\sin(\theta) \quad (11)$$

When employed as a vector multiplier, the multiplier circuit 104 can perform up-conversion and down conversion of the sensor output signal (e.g., the multiplier circuit 104 is configured as a mixer). Up-conversion means that a first signal "X" with a carrier frequency $F_{BB}$ is multiplied by a carrier frequency (a sinusoidal signal), $F_{LO}$, to create a high frequency signal that is $F_{RF}$, where $F_{RF}=F_{LO}+F_{BB}$. Down conversion means that a first signal "X" with a carrier frequency $F_{RF}$ is multiplied by a carrier frequency (a sinusoidal signal), $F_{LO}$, to create a low frequency signal $F_{BB}$, where $F_{BB}=F_{RF}-F_{LO}$. As a result, the frequency of the sensor output signal is UP/DOWN converted. No information is changed. Amplitude changes by a scalar factor that is constant with frequency. The down-converted low-frequency signal $F_{BB}$ may be extracted by configuring a biquadratic filter (e.g. 204a) in the AFE 106 as a low pass or band-pass filter. The up-converted high-frequency signal FRF may be extracted by configuring a biquadratic filter (e.g. 204a) in the AFE 106 as a band-pass filter.

In an example, the sensor output signal is a low frequency content baseband signal. The sensor 102 provides a low bandwidth output, and the sensor output is an electrical signal (voltage or current), that contains a lowest frequency=100 Hz, and a highest frequency=200 Hz. The multiplier circuit 104 is configured as a single scaling multiplier. Scaling implies M out of N multiplying units 904a-904n are turned ON. If all units 904a-904n are turned ON, the sensor output signal is not attenuated. If half are turned ON, then the sensor output signal is attenuated by 2× and so on.

In another example, the sensor output signal is a low frequency baseband signal that modulates a high frequency carrier signal. The sensor 102 provides a lower frequency baseband signal occupying a bandwidth where the lowest frequency is 100 Hz and highest is 200 Hz), but centered around a carrier frequency of 5 GHz. The lowest frequency is 5 GHz-50 Hz and highest frequency is 5 GHz+50 Hz. The multiplier circuit 104 is configured as a two multiplier vector multiplier functional as a mixer. In this case, the mixer is used to bring the signal to baseband by providing a LO frequency of 5 GHz. The resultant signal at the output would be at baseband, and would be applied to the AFE 106.

Figure 10:
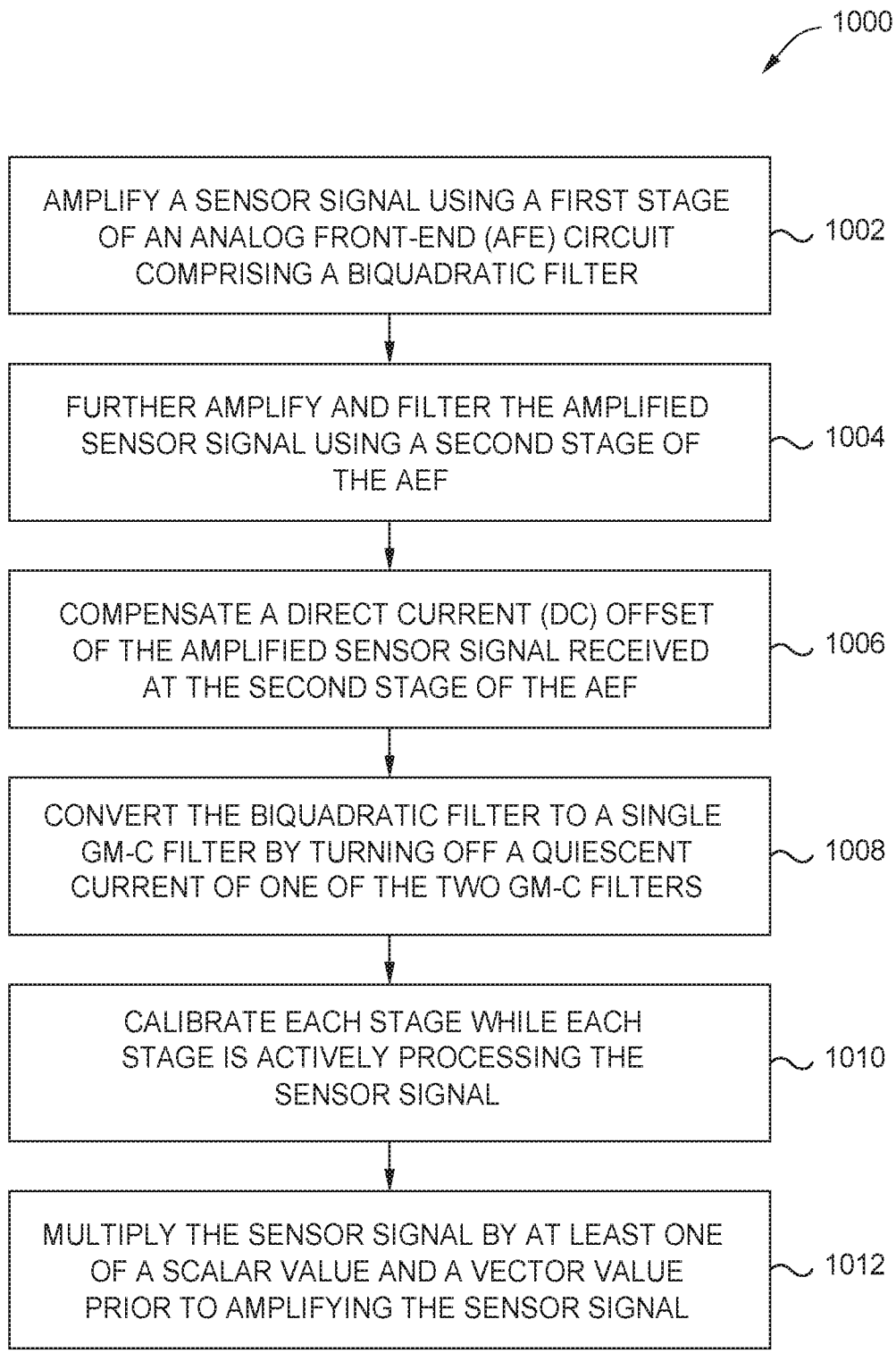
FIG. 10 is a process flow of a method for conditioning a sensor signal.

FIG. 10 is a process flow of a method 1000 for conditioning a sensor signal, according to an embodiment. At block 1002, the sensor signal is amplified and filtered using a first stage of an analog front-end (AFE) circuit 106. The first stage comprises a biquadratic filter comprising a first plurality of DC-coupled transconductance amplifiers. At block 1004, the amplified sensor signal is further amplified and filtered using a second stage of the AFE. The second stage comprises a second plurality of AC-coupled transconductance amplifiers. At block 1006, a direct current (DC) offset of the amplified sensor signal received at the second stage of the AFE 106 is compensated. The second stage comprises a second plurality of AC-coupled transconductance amplifiers. Each transconductance amplifier of the first plurality and of the second plurality has a programmable transconductance and comprises a plurality of subthreshold-biased transistors.

In an embodiment, the biquadratic filter (e.g. 204a) comprises two $G_m$-C filters connected in series. Accordingly, the method 1000 may further comprise block 1008 of converting the biquadratic filter to a single $G_m$-C filter by turning off a quiescent current of one of the two $G_m$-C filters. In an embodiment, the method 1000 may further comprise block 1010 of calibrating each stage (e.g. the biquadratic filter 204a) while each stage (e.g. the biquadratic filter 204a) is actively processing the sensor signal. In an embodiment, the method may further comprise block 1012 of multiplying the sensor signal by at least one of a scalar value and a vector value prior to amplifying the sensor signal. The blocks 1002-1012 of the method 1000 may be repeated any number of times.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. An analog front-end (AFE) circuit for conditioning a sensor signal, the AFE circuit comprising:
   a first stage configured to amplify and filter the sensor signal, the first stage comprising a biquadratic filter comprising a first plurality of DC-coupled transconductance amplifiers;
   a second stage configured to further amplify and filter the amplified sensor signal, and to compensate a direct current (DC) offset of the first stage, the second stage comprising a second plurality of AC-coupled transconductance amplifiers, wherein each transconductance amplifier of the first plurality of DC-coupled transconductance amplifiers and of the second plurality of AC-coupled transconductance amplifiers has a programmable transconductance and comprises a plurality of subthreshold-biased transistors; and
   a circuit coupled to each stage of the first and second stages to perform calibration of each stage while each stage is actively processing the sensor signal.

2. The AFE of claim 1, wherein the biquadratic filter is configured as a Tow-Thomas biquad (TTBQ) filter.

3. The AFE of claim 1, wherein the biquadratic filter is configured as one of a low pass filter and a bandpass filter.

4. The AFE of claim 1, wherein at least one of the first plurality of DC-coupled transconductance amplifiers of the first stage is loaded with a capacitor (C) to produce a transconductance-capacitance ($G_m$-C) filter.

5. The AFE of claim 1, wherein the biquadratic filter comprises:
   a first transconductance amplifier having a gain greater than a transconductance, wherein outputs of the first transconductance amplifier are loaded and coupled in parallel with a first capacitance to form a first $G_m$-C filter;
   a second transconductance amplifier having a gain less than about the transconductance, wherein inputs of the second transconductance amplifier are connected in series to the outputs of the first transconductance amplifier;
   a third transconductance amplifier having a gain equal to about the transconductance, wherein inputs of the third transconductance amplifier are connected in series to the outputs of the second transconductance amplifier, and wherein outputs of the third transconductance amplifier are loaded and coupled in parallel with a second capacitance to form a second $G_m$-C filter; and
   a fourth transconductance amplifier having a gain equal to about the transconductance, wherein inputs of the fourth transconductance amplifier are connected in series to the outputs of the third transconductance amplifier, and wherein outputs of the fourth transconductance amplifier are cross-fed in negative feedback to summing nodes at the inputs of the second transconductance amplifier.

6. The AFE of claim 5, wherein the biquadratic filter is convertible to a single pole Gm-C filter by turning off a quiescent current of one of the first $G_m$-C filter and the second $G_m$-C filter.

7. The AFE of claim 1, wherein the second stage comprises:
   a first transconductance amplifier having a gain greater than a transconductance, wherein outputs of the first transconductance amplifier are coupled to first terminals of DC blocking capacitors; and
   a second transconductance amplifier having a gain equal to about the transconductance, wherein inputs of the second transconductance amplifier are coupled to second terminals of the DC blocking capacitors, and wherein outputs of the second transconductance amplifier are cross-fed in negative feedback to inputs of the second transconductance amplifier.

8. A system for conditioning and detecting a sensor signal, comprising:
   a multiplier circuit for performing a multiplication operation on the sensor signal to produce a multiplied sensor signal;
   an analog front-end (AFE) circuit coupled to the multiplier circuit to produce a conditioned sensor signal from the multiplied sensor signal, the AFE comprising:
      a first stage configured to amplify and filter the sensor signal, the first stage comprising a biquadratic filter comprising a first plurality of DC-coupled transconductance amplifiers; and
      a second stage configured to further amplify and filter the amplified sensor signal, and to compensate a direct current (DC) offset of the first stage, the second stage comprising a second plurality of AC-coupled transconductance amplifiers, wherein each transconductance amplifier of the first plurality of DC-coupled transconductance amplifiers and of the second plurality of AC-coupled transconductance amplifiers has a programmable transconductance and comprises a plurality of subthreshold-biased transistors; and
   a detector circuit coupled to the AFE to determine a presence of the conditioned sensor signal.

9. The system of claim 8, wherein the multiplication operation is one of a scalar multiplication operation and a vector multiplication operation.

10. The system of claim 9, wherein the multiplier circuit comprises N number of units, wherein the multiplier circuit implements a scalar multiplication operation by selecting K units out of N units simultaneously to produce a scalar multiplication of K/N, wherein K and N are both integers, K is less than or equal to N, and N is at least 1.

11. The system of claim 9, wherein the multiplier circuit implements a vector multiplication operation by employing two scalar multipliers implementing two scalar multiplication operations that are out of phase.

12. The system of claim 8, wherein the multiplier circuit performs up-conversion or down-conversion of the sensor signal.

13. The system of claim 8, wherein the detector circuit comprises:
  an analog-to-digital (ND) converter to digitize the conditioned sensor signal; and
  a microprocessor to digitally sense the digitized and conditioned sensor signal, to provide digital values to program parameters of each of the first plurality of DC-coupled transconductance amplifiers based on the digital values, to operate the A/D converter, and to provide digital values to program parameters of the multiplier circuit.

14. The system of claim 13, further comprising a clock system for providing clock signals to the multiplier circuit, the AFE, and the A/D converter.

15. The system of claim 8, wherein the detector circuit is further configured to provide a control signal to the multiplier circuit and the AFE to cause the system to bypass the multiplier circuit by feeding the sensor signal directly to the AFE when the sensor signal is a baseband signal.

16. A method for conditioning a sensor signal, comprising:
  amplifying and filtering the sensor signal using a first stage of an analog front-end (AFE) circuit, the first stage comprising a biquadratic filter comprising two $G_m$-C filters connected in series;
  further amplifying and filtering the amplified sensor signal using a second stage of the AFE, the second stage comprising a plurality of AC-coupled transconductance amplifiers;
  compensating a direct current (DC) offset of the first stage using the second stage, wherein the two $G_m$-C filters and each transconductance amplifier of the plurality of AC-coupled transconductance amplifiers has a programmable transconductance and comprises a plurality of subthreshold-biased transistors; and
  converting the biquadratic filter to a single $G_m$-C filter by turning off a quiescent current of one of the two $G_m$-C filters.

17. The method of claim 16, further comprising calibrating each stage while each stage is actively processing the sensor signal.

18. The method of claim 16, further comprising multiplying the sensor signal by at least one of a scalar value and a vector value prior to amplifying the sensor signal.

* * * * *